US010809055B2

(12) United States Patent
Huang

(10) Patent No.: US 10,809,055 B2
(45) Date of Patent: Oct. 20, 2020

(54) APPARATUS AND METHOD FOR MEASURING TOPOGRAPHY AND GRADIENT OF THE SURFACES, SHAPE, AND THICKNESS OF PATTERNED AND UNPATTERNED WAFERS

(71) Applicant: KLA Corporation, Milpitas, CA (US)

(72) Inventor: Chunsheng Huang, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/517,153

(22) Filed: Jul. 19, 2019

(65) Prior Publication Data
US 2020/0033117 A1    Jan. 30, 2020

Related U.S. Application Data

(60) Provisional application No. 62/702,726, filed on Jul. 24, 2018.

(51) Int. Cl.
*G01B 11/24*    (2006.01)
*H01L 21/66*    (2006.01)

(52) U.S. Cl.
CPC .......... *G01B 11/2441* (2013.01); *H01L 22/12* (2013.01)

(58) Field of Classification Search
CPC ............ G01B 11/2441; G01B 9/02057; G01B 9/02098; G01B 2290/70
See application file for complete search history.

(56) References Cited

U.S. PATENT DOCUMENTS

| 4,872,755 A * | 10/1989 | Kuchel ..................... G01J 9/02 356/495 |
| 5,841,536 A | 11/1998 | Dimmick |
| 6,184,994 B1 | 2/2001 | Freischlad |
| 6,847,458 B2 | 1/2005 | Freischlad et al. |
| 7,054,051 B1 * | 5/2006 | Bloom .................. G02B 26/06 359/276 |

(Continued)

FOREIGN PATENT DOCUMENTS

| CN | 103256991 A | 8/2013 |
| CN | 103424196 A | 12/2013 |

OTHER PUBLICATIONS

Bills, Richard E., "High accuracy interferometric measurements of EUVL mask blank substrates", Proc. SPIE, vol. 10314, Optifab 2003, Technical Digest, May 19, 2003, SPIEDigitalLibrary.org/conference-proceedings-of-spie, Downloaded Jun. 1, 2018, pp. 1031418-1-1031418-3.

(Continued)

*Primary Examiner* — Jonathan M Hansen
(74) *Attorney, Agent, or Firm* — Suiter Swantz pc llo

(57) ABSTRACT

An interferometer system may include a stage assembly configured to receive and secure a sample, an illumination source configured to generate an illumination beam, a half-wave plate, one or more shearing prisms to shear the illumination beam into two beamlets along a shearing direction, a reference flat disposed proximate to the sample, a detector assembly, and a controller. The controller may cause the illumination source to generate an illumination beam and sweep the illumination beam across a plurality of wavelengths, and determine both a surface height measurement and a surface slope measurement of the sample based on the illumination received by the detector assembly.

37 Claims, 8 Drawing Sheets

(56) References Cited

U.S. PATENT DOCUMENTS

| | | |
|---|---|---|
| 7,930,113 B1 | 4/2011 | Huang et al. |
| 8,537,369 B1 | 9/2013 | Tang |
| 2004/0257587 A1 | 12/2004 | Rosakis et al. |
| 2005/0278126 A1 | 12/2005 | Rosakis et al. |
| 2006/0285123 A1 | 12/2006 | Evans et al. |
| 2013/0141712 A1 | 6/2013 | Blain et al. |
| 2014/0293291 A1* | 10/2014 | Tang ................ G01B 11/2441 356/511 |
| 2016/0372353 A1 | 12/2016 | Vukkadala et al. |

OTHER PUBLICATIONS

Tang, Shouhong et al., "High accuracy measurements of objects with multiple reflective surfaces with wavelength shifting interferometry", Proc. SPIE, vol. 6723, 3rd International Symposium on Advanced Optical Manufacturing and Testing Technologies: Optical Test and Measurement Technology and Equipment, Nov. 21, 2007, doi:10.1117/12.782882, pp. 67230F-1-67230E-10.

* cited by examiner

US 10,809,055 B2

APPARATUS AND METHOD FOR MEASURING TOPOGRAPHY AND GRADIENT OF THE SURFACES, SHAPE, AND THICKNESS OF PATTERNED AND UNPATTERNED WAFERS

CROSS-REFERENCE TO RELATED APPLICATION

The present application claims the benefit under 35 U.S.C. § 119(e) of U.S. Provisional Application Ser. No. 62/702,726, filed Jul. 24, 2018, entitled APPARATUS AND METHOS MEASURING TOPOGRAPHY AND GRADIENT OF THE SURFACES, SHAPE, AND THICKNESS OF THE PATTERNED AND UNPATENTED WAFERS, naming Chunsheng Huang as inventor, which is incorporated herein by reference in the entirety.

TECHNICAL FIELD

The present invention generally relates to the field of metrology, and, more particularly, to a system and method for measuring the gradient, slope, and thickness of both patterned and unpatterned wafers using interferometric techniques.

BACKGROUND

Metrology methods based on interferometry have been used in the art of semiconductor fabrication in order to measure certain characteristics of both patterned and unpatterned samples, including surface height and surface slope. For example, sample flatness/topography measurements (e.g., surface height measurements) may be measured using dual Fizeau interferometers which measure opposing sides of the sample surface topography simultaneously. With surface height interferometers such as Fizeau interferometers, a numeric derivative is required to obtain the slope of the surface topography. However, the dynamic range (e.g., amount of slope) of the sample warp is limited by both optics and the number of pixels within a pixelized detector assembly. As the slope increases, the fringes may become too dense for the detector assembly to determine a contrast, and measurement data is unable to be retrieved. In order to measure a full surface of a large warp sample using a Fizeau interferometer, the sample may be tilted in order to reduce the number of fringes per unit area. Interferograms may then be generated one at a time and subsequently stitched together in order to generate a full surface map. However, this time-consuming process may negatively impact throughput.

Conversely, shearing interferometric techniques including Coherence Gradient Sensing (CGS) methods, heterodyne interferometers, and Nomarski differential interference microscopes (NDIC) may be utilized to collect sample slope measurements. With shearing interferometers, shearing prisms (e.g., Nomarski prisms, and the like) are utilized to separate two orthogonally polarized beams laterally in space to create wavefront shear. By moving the shearing prism in the direction of the shear, the phase modulation may be achieved, and surface topography data (e.g., sample slope measurements) may be collected from the interference intensity data. As compared to Fizeau interferometers, shearing interferometers may exhibit a large dynamic range suitable for measuring relatively large surface variations including, but not limited to, sample warp. However, integration processes of shearing interferometers may be difficult to implement or inefficient for measuring surface topology as compared to non-shearing interferometers.

Furthermore, previous interferometric devices may be configured to determine either surface height measurements or surface slope measurements, but not both. Therefore, in order to collect both surface height and surface slope measurements, multiple interferometers and/or interferometric techniques must be used, increasing cost and drastically decreasing throughput in a semiconductor fabrication process.

Therefore, it would be desirable to provide a system and method that cure the shortfalls of the previous approaches identified above.

SUMMARY

An interferometer system is disclosed in accordance with one or more illustrative embodiments of the present disclosure. In one illustrative embodiment, the system includes a stage assembly to receive and secure a sample. In another illustrative embodiment, the system includes one or more optical metrology sub-systems. In another illustrative embodiment, at least one of the one or more optical metrology sub-systems includes an illumination source configured to generate an illumination beam. In another illustrative embodiment, at least one of the one or more optical metrology sub-systems includes a polarizing beamsplitter to pass at least a portion of the illumination beam having a selected polarization direction. In another illustrative embodiment, at least one of the one or more optical metrology sub-systems includes a half-wave plate. In another illustrative embodiment, at least one of the one or more optical metrology sub-systems includes a shearing prism to shear the illumination beam into two beamlets along a shearing direction, where the half-wave plate adjusts a polarization of the illumination beam on the shearing prism. In another illustrative embodiment, at least one of the one or more optical metrology sub-systems includes a reference flat disposed proximate to the sample. In another illustrative embodiment, at least one of the one or more optical metrology sub-systems includes a detector assembly configured to receive illumination reflected from a surface of the sample that propagates back through the shearing prism and the half-wave plate and is further passed by the polarizing beamsplitter. In another illustrative embodiment, the system includes a controller. In another illustrative embodiment, the controller generates one or more control signals to cause the illumination source to sweep the illumination beam across a plurality of wavelengths. In another illustrative embodiment, the controller determines a surface height measurement of the sample based on the illumination received by the detector assembly, where the surface height measurement is based on interference of a portion of the illumination beam reflected from the sample and a portion of the illumination beam reflected from a surface of the reference flat associated with the plurality of wavelengths. In another illustrative embodiment, the controller determines a surface slope measurement of the sample along the shearing direction based on the illumination received by the detector assembly, wherein the surface slope measurement is based on interference between the two beamlets reflected from the surface of the sample associated with the plurality of wavelengths.

An interferometer system is disclosed in accordance with one or more illustrative embodiments of the present disclosure. In one illustrative embodiment, the system includes a stage assembly configured to receive and secure a sample. In another illustrative embodiment, the system includes one or more optical metrology sub-systems. In another illustrative embodiment, at least one of the one or more optical-metrology sub-systems includes an illumination source configured to generate an illumination beam. In another illustrative embodiment, at least one of the one or more optical-metrology sub-systems includes a polarizer to pass at least a portion of the illumination beam. In another illustrative embodiment, at least one of the one or more optical-metrology sub-systems includes a non-polarizing beamsplitter. In another illustrative embodiment, at least one of the one or more optical-metrology sub-systems includes a shearing prism oriented to shear the illumination beam into two beamlets along a shearing direction. In another illustrative embodiment, at least one of the one or more optical-metrology sub-systems includes a reference flat disposed proximate to the sample. In another illustrative embodiment, at least one of the one or more optical-metrology sub-systems includes an analyzer having a polarization direction crossed with respect to the polarizer. In another illustrative embodiment, at least one of the one or more optical-metrology sub-systems includes a detector assembly to receive illumination reflected from a surface of the sample that propagates back through the shearing prism, the non-polarizing beamsplitter, and the analyzer. In another illustrative embodiment, the system includes a controller. In another illustrative embodiment, the controller generates one or more control signals to cause the illumination source to sweep the illumination beam across a plurality of wavelengths. In another illustrative embodiment, the controller determines a surface height measurement of the sample based on the illumination received by the detector assembly, where the surface height measurement is based on interference of a portion of the illumination beam reflected from the sample and a portion of the illumination beam reflected from a surface of the reference flat associated with the plurality of wavelengths. In another illustrative embodiment, the controller determines a surface slope measurement of the sample along the shearing direction based on the illumination received by the detector assembly, wherein the surface slope measurement is based on interference between the two beamlets reflected from the surface of the sample associated with the plurality of wavelengths.

A method is disclosed in accordance with one or more illustrative embodiments of the present disclosure. In one illustrative embodiment, the method includes generating an illumination beam with an illumination source and performing a sweep of the illumination beam across a plurality of wavelengths. In another illustrative embodiment, the method includes shearing the illumination beam into two beamlets along a shearing direction with one or more shearing prisms. In another illustrative embodiment, the method includes directing the two beamlets through a reference flat disposed proximate to a sample. In another illustrative embodiment, the method includes receiving illumination reflected from a surface of the sample with a detector assembly. In another illustrative embodiment, the method includes generating one or more interferograms based on the illumination received by the detector assembly. In another illustrative embodiment, the method includes determining a surface height measurement of the sample based on the one or more generated interferograms, where the surface height measurement is based on interference of a portion of the illumination beam reflected from the sample and a portion of the illumination beam reflected from a surface of the reference flat associated with the plurality of wavelengths. In another illustrative embodiment, the method includes determining a surface slope measurement of the sample along the shearing direction based on the one or more generated interferograms, wherein the surface slope measurement is based on interference between the two beamlets reflected from the surface of the sample associated with the plurality of wavelengths.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

Figure 1:
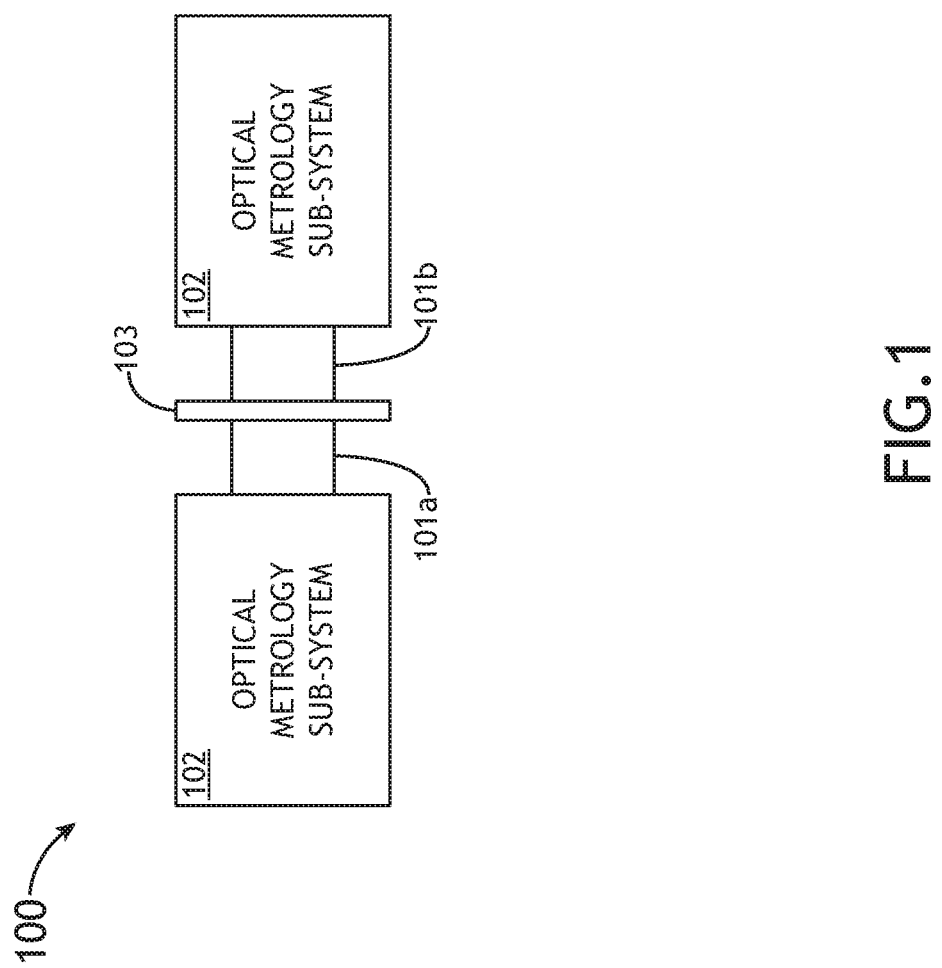
FIG. 1 illustrates a simplified block diagram of an interferometer system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Many metrology methods based on interferometry have been used in the art of semiconductor fabrication in order to measure certain characteristics of both patterned and unpatterned samples, including surface height and surface slope. For example, Fizeau interferometers have been used to collect sample flatness measurements (e.g., surface height measurements), and variations of shearing interferometers (e.g., heterodyne interferometers, Nomarski differential interference microscopes (NDIC), and the like) have been used to collect surface slope measurements. However, traditional interferometric devices are not able to determine both surface height measurements or surface slope measurements. Therefore, in order to collect both surface height and surface slope measurements, multiple interferometers and/or interferometric techniques must be used, increasing cost and drastically decreasing throughput in a semiconductor fabrication process.

Accordingly, embodiments of the present disclosure are directed to an interferometry system and method which cure one or more of the shortfalls of previous approaches identified above. Embodiments of the present disclosure are directed to an interferometry system which is configured to measure semiconductor patterned and unpatterned wafer topography, shape, and slope using both height and shear interferometric techniques. Additional embodiments of the present disclosure are directed to an interferometry system configured to perform both surface height measurements (e.g., Fizeau interferometry) and surface slope measurements (e.g., shearing interferometry). Additional embodiments of the present disclosure are directed to an interferometry system configured to simultaneously perform both surface height measurements (e.g., Fizeau interferometry) and surface slope measurements (e.g., shearing interferometry). Further embodiments of the present disclosure are directed to an interferometry system including a tunable illumination source which is configured to collect surface height measurements and surface slope measurements simultaneously.

It is contemplated herein that the system and method of the present disclosure may drastically simplify metrology processes utilizing interferometric techniques. The interferometer system of the present disclosure may be configured to function as both a Fizeau interferometer (e.g., in a "Fizeau mode") and a shearing interferometer (e.g., in a "shearing mode"), enabling rapid transitions between Fizeau interferometer measurements and shearing interferometer measurements. It is further contemplated herein that the interferometer system of the present disclosure may be configured to function simultaneously as both a Fizeau interferometer and a shearing interferometer (e.g., in a "dual shearing/Fizeau mode"), enabling simultaneous measurement of surface height and surface slope of a sample. In this regard, the interferometer system and method of the present disclosure may decrease cost and increase throughput in a semiconductor fabrication and/or inspection process.

FIG. 1 illustrates a simplified block diagram of an interferometer system 100, in accordance with one or more embodiments of the present disclosure. The interferometer system 100 may include, but is not limited to, one or more optical metrology sub-systems 102 configured to perform one or more metrology processes on a sample 103.

In one embodiment, the interferometer system 100 may include a dual interferometer system configured to perform measurements on diametrically opposite sides of the sample 103. For example, interferometer system 100 may include a first optical metrology sub-system 102 configured to generate a first illumination beam 101a in order to perform one or more measurements on a first surface of the sample 103, and a second optical metrology sub-system 102 configured to generate a second illumination beam 101b in order to perform one or more measurements on a second surface of the sample 103 opposite the first surface. In another embodiment, the first and second optical metrology sub-systems 102 are configured to perform measurements on opposite sides of the sample 103 simultaneously. The first optical metrology sub-system 102 and the second optical metrology sub-system 102 may be identical, but they need not be identical in all embodiments.

The sample 103 may include any sample known in the art including, but not limited to, a wafer, a semiconductor wafer, a reticle, a mask, and the like. In one embodiment, the sample 103 may be disposed on/within a holding mechanism. For example, interferometer system 100 may include a holding mechanism (not shown) configured to hold the sample 103 vertically or substantially vertically.

Figure 2A:
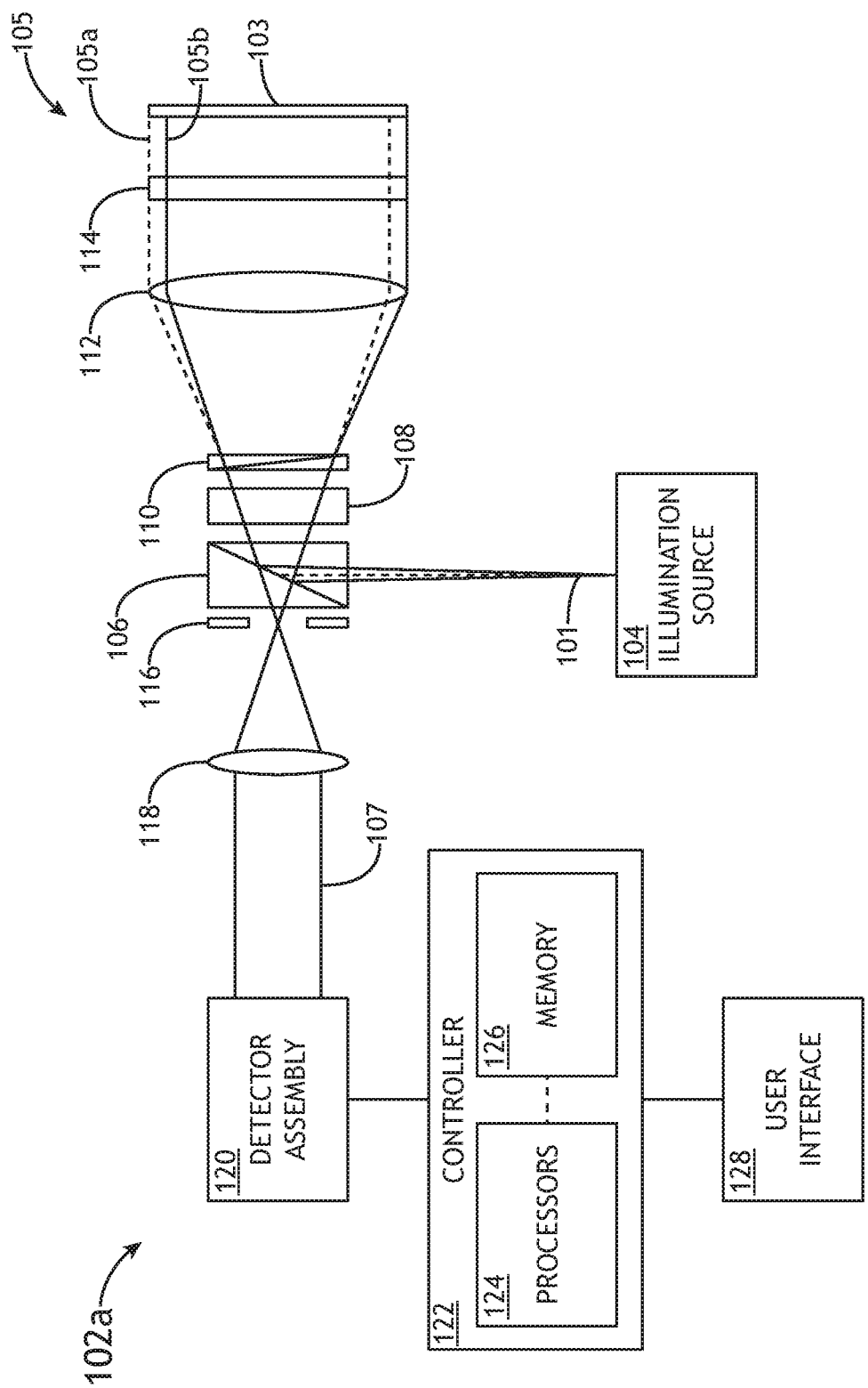
FIG. 2A illustrates a simplified block diagram of an optical metrology sub-system of an interferometer system, in accordance with one or more embodiments of the present disclosure.

FIG. 2A is a simplified block diagram of an optical metrology sub-system 102a of an interferometer system 100, in accordance with one or more embodiments of the present disclosure. In this regard, the optical metrology sub-system 102a depicted in FIG. 2A illustrates a single instance of the optical metrology sub-system 102 depicted in FIG. 1.

In one embodiment, the optical metrology sub-system 102a may include, but is not limited to, an illumination source 104 configured to generate an illumination beam 101, a beam splitter 106, a half-wave plate 108, a shearing prism 130, a reference flat 114, a detector assembly 120, and a controller 122 including one or more processors 124 and a memory 126. The one or more processors 124 of the controller 122 may be configured to execute a set of program instructions stored in memory 126, the set of program instructions configured to cause the one or more processors to carry out various steps and processes of the present disclosure. It is contemplated herein that not all components above are necessary in the optical path of the optical metrology sub-system 102 and that particular embodiments may include various combinations of elements. In another embodiment, the optical metrology sub-system 102a may include one or more components mounted on a translation stage (e.g., a chuck, or the like) to selectively include or remove the associated components.

It is contemplated herein that the optical metrology sub-system 102a may be configured to function simultaneously as a Fizeau interferometer and a shearing interferometer. In this regard, the optical metrology sub-system 102a illustrated in FIG. 2 may be configured to concurrently (i.e. simultaneously) perform surface height measurements and surface slope measurements. In additional and/or alternative embodiments, the optical metrology sub-system 102a may be configured to rapidly switch between performing Fizeau interferometry and shearing interferometry.

In both Fizeau and shearing modes, the polarizing beam-splitter 106 may provide a linearly polarized portion of the illumination beam 101 to the half-wave plate 108, which may be rotated to rotate the polarization of the illumination beam 101 to any selected angle. Further, this linearly polarized illumination beam 101 is split such that at least one portion of the illumination beam 101 reflects off of the sample 103, subsequently recombined, and then directed to the detector assembly 120. Accordingly, the detector assembly 120 may capture one or more interferograms having variations indicative of the topology of the sample 103. In some embodiments, a collimator 112 may collimate the illumination beam 101 (or a portion thereof) for interaction with the sample 103. The collimator 112 may include any collimator or collimating optical elements known in the art including, but not limited to, an aspherical collimating lens. In another embodiment, collimated beamlets 105a, 105b may then pass through the reference flat 114 disposed proximate to the sample 103.

Further, various components of the optical metrology sub-system 102a may be selectively configured to provide Fizeau and shearing modes of operations sequentially or simultaneously.

To generate Fizeau fringes, a portion of the illumination beam 101 reflected from the sample 103 and a portion of the illumination beam 101 reflected from a surface of the reference flat 114 are combined, and the combined illumination 107 is directed to the detector assembly 120. In this regard, variations in interference fringes in an interferogram captured by the detector assembly 120 may be indicative of surface height variations on the sample 103. Further, the reference flat 114 may include any transflat or reference flat structure known in the art. For example, the reference flat 114 may include a small wedge optical plate with a reference surface facing the sample 103. The wedge surface of the reference flat 114 may be configured to deflect reflection illumination from the wedge surface such that reflected illumination is not captured by the detector assembly 120.

To generate shearing fringes, a shearing prism 130 may split the illumination beam 101 into two beamlets 105a, 105b. The beamlets 105a, 105b are then reflected from the sample 103 at different locations and recombined by the shearing prism 130. The combined illumination 107 is then directed to the detector assembly 120 such that the detector assembly 120 may capture one or more interferograms having variations indicative of the slope of features on the sample 103.

Figure 2B:
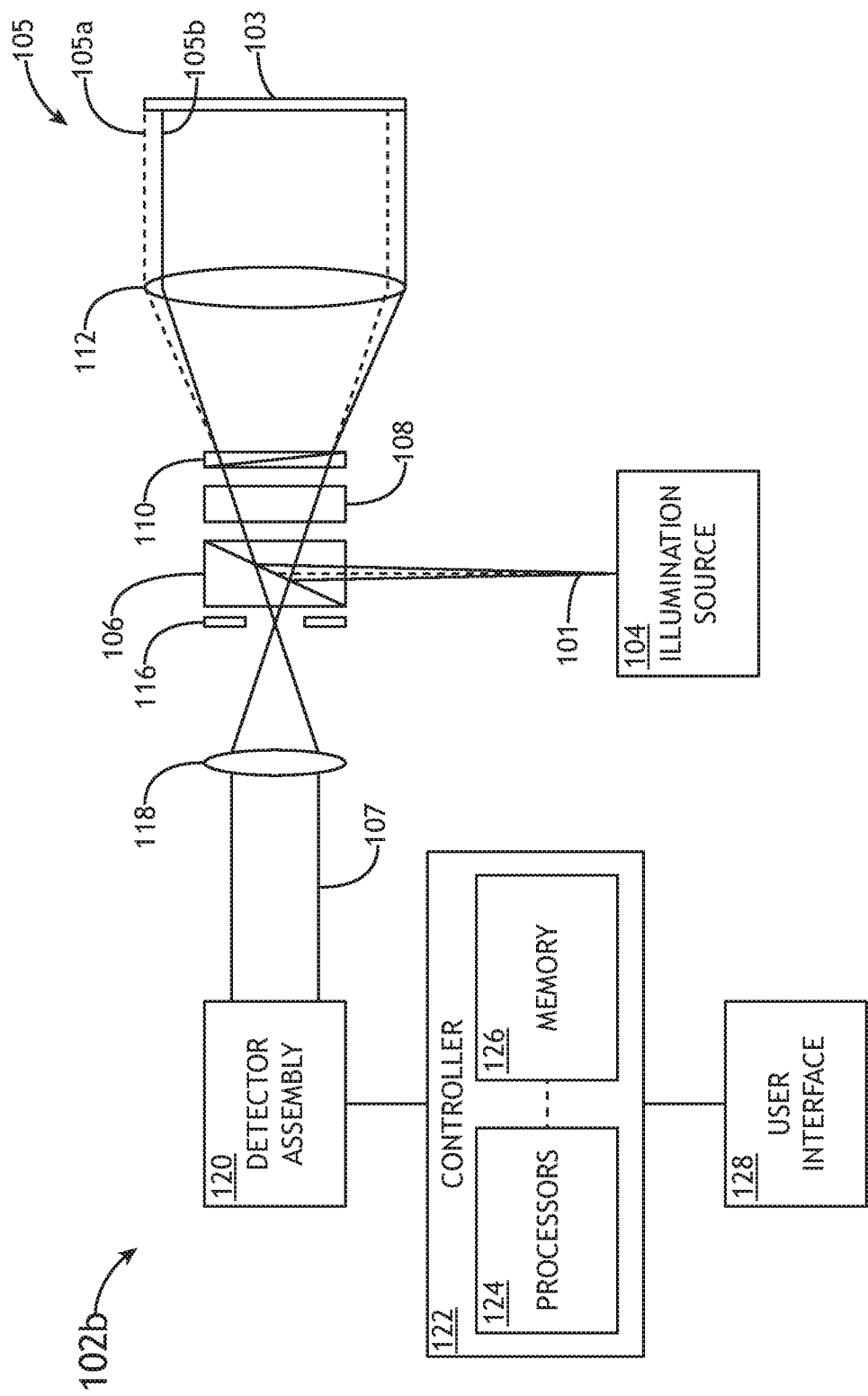
FIG. 2B illustrates a simplified block diagram of an optical metrology sub-system of an interferometry system, in accordance with one or more embodiments of the present disclosure.

The optical metrology sub-system 102a may switch between Fizeau and shearing modes through selective configurations of various components. In one embodiment, the optical metrology sub-system 102a may be configured to generate only Fizeau fringes by removing the shearing prism 130 from the optical path (e.g., by translating the prism chuck 110) such that the illumination beam 101 is not sheared into beamlets 105a, 105b. Further, a quarter-wave plate may be inserted in the optical path (e.g., in the place of the shearing prism 130) such that the illumination reflected from the sample 103 may pass through a polarizing beamsplitter 106. In another embodiment, the optical metrology sub-system 102a may be configured to generate only shearing fringes by removing the reference flat 114 from the optical path. For example, FIG. 2B is a simplified block diagram of an optical metrology sub-system 102b without a reference flat 114, in accordance with one or more embodiments of the present disclosure. In another embodiment, the optical metrology sub-system 102a may be configured to generate both Fizeau and shearing fringes by both shearing the illumination beam 101 into beamlets 105a, 105b and placing the reference flat 114 in the optical path. In this regard, a portion of each of the beamlets 105a, 105b may reflect from the reference flat 114 such that the illumination 107 may include both Fizeau and shearing fringes.

It is noted herein that tuning of the optical path difference (OPD) between arms of the optical metrology sub-system 102 and capturing multiple associated interferograms may be required in order to extract information regarding the sample 103 (e.g., surface height measurements, surface slope measurements, and the like). The optical metrology sub-system 102 may thus be configured to implement a variety of tuning techniques depending on the mode of operation being used. For example, tuning may be implemented by varying the wavelength of the illumination beam 101 (e.g., wavelength tuning) in both Fizeau and shearing modes. By way of another example, in a shearing mode, tuning may be achieved through mechanical actuation of the shearing prism 130. In a general sense, tuning may be achieved by any technique known in the art.

In another embodiment, the controller 122 communicatively coupled to the detector assembly 120 is configured to determine one or more measurements of the sample 103 based on the received illumination 107 associated with multiple interferograms associated with different OPDs through the use of one or more phase retrieval algorithms. The controller 122 may implement any phase retrieval algorithm, or combination thereof, known in the art to extract data associated with the sample 103 from multiple interferograms associated with different OPDs. It is further contemplated herein that different phase retrieval algorithms, or combinations thereof, may be employed to extract data associated with the sample 103 from multiple interferograms based on the operational mode.

Further, it is contemplated herein that the rate at which interference fringes shift during OPD tuning may differ for Fizeau and shearing modes such that contributions of the Fizeau and shearing may be differentiated based on the relative shift rates.

Referring now generally to FIGS. 2A through 5, the operation of the optical metrology sub-system 102 is described in greater detail.

The detector assembly 120 may include any detector assembly 120 may include any detector assembly known in the art including, but not limited to, a pixelated detector, a charge coupled device (CCD) detector, a complementary metal-oxide-semiconductor (CMOS) detector, a shearing camera, and the like. In another embodiment, the detector assembly 120 is configured to generate one or more interferograms based on the received illumination 107 reflected from the surface of the sample. The one or more processors 124 may be configured to store the generated interferograms in memory 126.

In one embodiment, controller 122 is configured to cause the illumination source 104 to generate an illumination beam 101. The illumination source 104 may include any illumination source known in the art including, but not limited to, a broadband illumination source (e.g., discharge lamp, laser-sustained plasma (LSP) source), a narrowband illumination source (e.g., a laser source), and the like. For example, the illumination source 104 may include a tunable laser illumination source or a light emitting diode (LED). The illumination source 104 may include a coherent or a non-coherent illumination source 104. It is noted herein that the use of a broadband illumination source may overcome an issue associated with narrow-band illumination, which prevents such interferometer systems from measuring certain thin film samples due to destructive interference. In additional embodiments, the optical metrology sub-system 102a may include one or more optical elements configured to adjust one or more or more characteristics of the illumination beam 101. For example, optical metrology sub-system 102a may further include, but is not limited to, prisms, filters, mirrors, lenses, and the like.

It is noted herein that a single illumination source 104 may be configured to provide one or more illumination beams 101 to one or more optical metrology sub-systems 102 of the interferometry system 100. For example, the illumination source 104 depicted in FIG. 2A may be configured to direct a first illumination beam 101a to a first surface of the sample 103, and may be configured to direct a second illumination beam 101b to a second surface of the sample 103 opposite the first side. In this regard, the first and second optical metrology sub-systems 102 illustrated in FIG. 1 may be configured to share a single illumination source 104. Similarly, it is contemplated herein that two or more optical metrology sub-systems 102 may share additional components including, but not limited to, a controller 122, a user interface 128, and the like.

The illumination source 104 may be configured to direct the illumination beam 101 to a beam splitter 106. In one embodiment, the beam splitter 106 includes a polarizing beam splitter (PBS). The polarizing beam splitter 106 may be configured to receive the illumination beam 101 from the illumination source 104 and direct the illumination beam 101 to a half-wave plate 108. In one embodiment, the polarizing beam splitter 106 is configured to polarize the illumination beam 101 into a p-polarization (e.g., parallel to a plane of incidence) and an s-polarization (e.g., perpendicular to a plane of incidence), where one of the two polarizations is directed to the half-wave plate 108. Further, though not shown, the optical metrology sub-system 102 may include a polarizer and/or a polarization rotator to align the polarization of the illumination beam 101 to provide a desired intensity on the sample 103.

In one embodiment, the half-wave plate 108 is configured to receive the illumination beam 101 from the polarizing beam splitter 106 and control a polarization of the illumination beam 101.

As noted previously herein, the optical metrology sub-system 102a may be configured to perform Fizeau interferometry, shearing interferometry, or both Fizeau interferometry and shearing interferometry. In this regard, the optical metrology sub-system 102a may be configured to operate in a "shearing mode," a "Fizeau mode," or a "dual shearing/Fizeau mode." The controller 122 may be configured to set which operational mode the optical metrology sub-system 102a operates in by selectively setting the positioning of the half-wave plate 108, prism chuck 110, and reference flat 114. Furthermore, the controller 122 may be configured to perform various tuning methods compatible with each operational mode. Each of these modes will be addressed in turn.

In a shearing mode, the illumination source 104 may be configured to generate an illumination beam 101 and direct the illumination beam to the beam splitter 106 and half-wave plate 108. The illumination beam 101 may then be directed to the prism chuck 110 including one or more shearing prisms 130, where the illumination beam 101 is sheared into two beamlets 105a, 105b along a first shearing direction. In a shearing mode, the half-wave plate 108 may be configured to direct the illumination beam 101 to the prism chuck 110 such that the first beamlet 105a and the second beamlet 105b exhibit equal intensities.

In another embodiment, the prism chuck 110 includes one or more shearing prisms 130 (shown in FIGS. 3-5) configured to shear the illumination beam 101 into two beamlets 105a, 105b having orthogonal polarizations along a specified direction (e.g., a shearing direction). In one embodiment, the half-wave plate 108 is configured to direct the illumination beam 101 to the prism chuck 110 such that the first beamlet 105a and the second beamlet 105b generated by a shearing prism 130 exhibit equal intensities. For example, the crystal axis (e.g., optical axis) of the half-wave plate 108 may be oriented at a 22.5° angle with respect to optic axes of the respective shearing prism 130. Accordingly, the illumination beam 101 incident on the shearing prism 130 may be 45° with respect to the shearing direction, thereby resulting in equal amplitude of the beamlets 105a, 105b from the shearing prism 130. The shearing prisms 130 are further shown and described in FIGS. 3-4.

Figure 3:
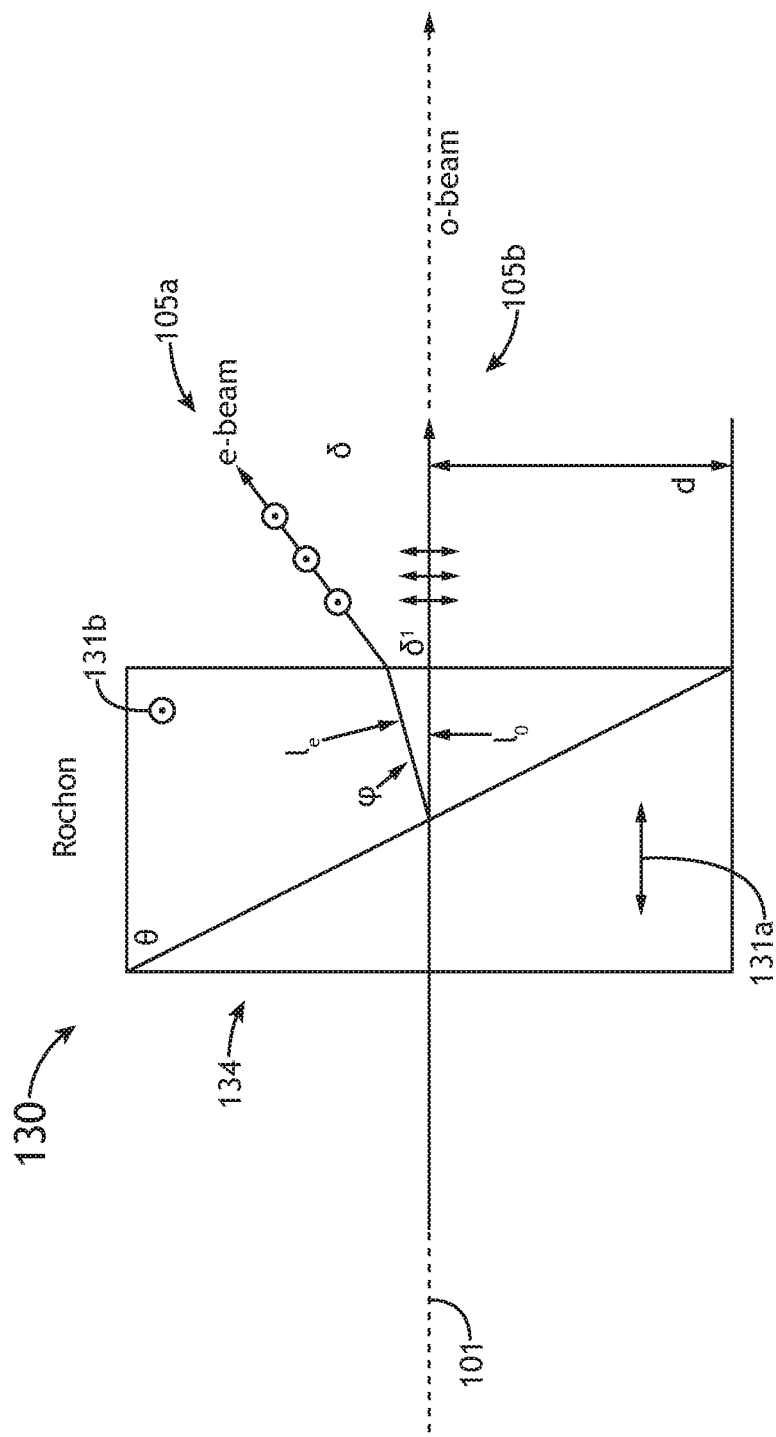
FIG. 3 illustrates a cross-sectional view of a Rochon prism, in accordance with one or more embodiments of the present disclosure.
Figure 4:
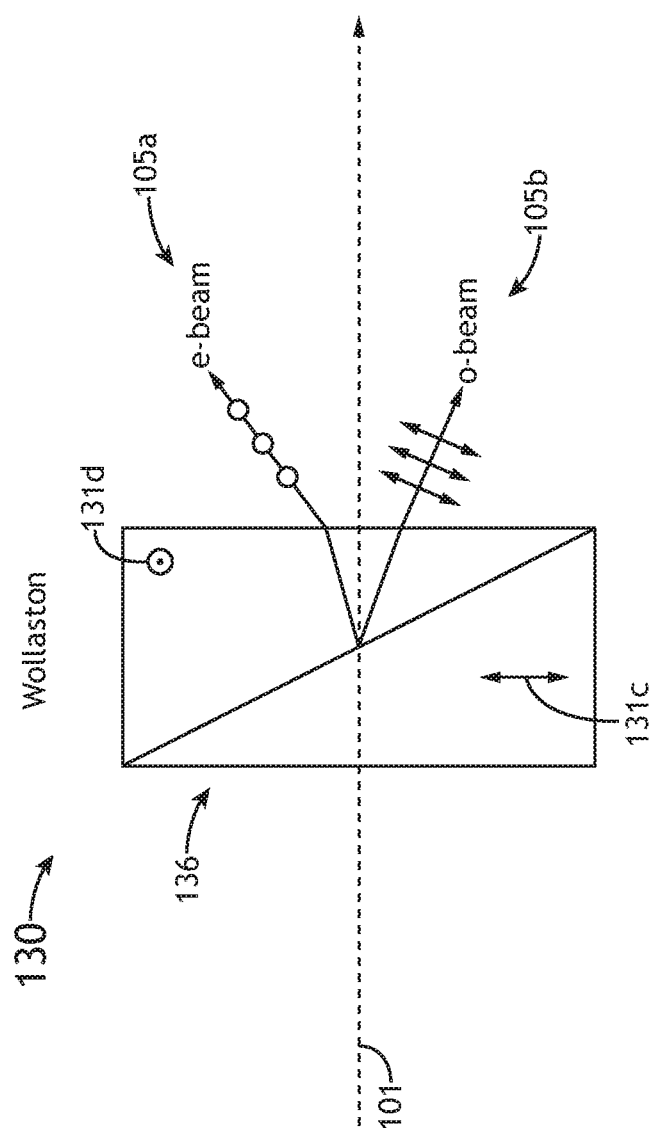
FIG. 4 illustrates a cross-sectional view of a Wollaston prism, in accordance with one or more embodiments of the present disclosure.

FIG. 3 illustrates a cross-sectional view of a Rochon prism 134, in accordance with one or more embodiments of the present disclosure. FIG. 4 illustrates a cross-sectional view of a Wollaston prism 136, in accordance with one or more embodiments of the present disclosure.

The one or more shearing prisms 130 may be formed from two coupled prisms formed from a birefringent material, wherein the two respective coupled prisms include orthogonal optical axes. In this regard, the one or more shearing prisms 130a, 130b may include any shearing prisms known in the art including, but not limited to, a Rochon prism 134, a Wollaston prism 136, a Nomarski prism, and the like. The characteristics of the one or more shearing prisms 130a, 130b may be dependent upon the orientations of the crystal axes (e.g., optical axes) of the shearing prisms 130a, 130b. For example, the Rochon prism 134 illustrated in FIG. 3 exhibits a horizontal first optical axis 131a parallel to the surface of the page, and a second optical axis 131b orthogonal to the surface of the page. Similarly, the Wollaston prism 136 illustrated in FIG. 4 exhibits a vertical first optical axis 131c parallel to the surface of the page, and a second optical axis 131d orthogonal to the surface of the page.

Furthermore, the one or more shearing prisms 130a, 130b (e.g., Rochon prism 134, a Wollaston prism 136, or a Nomarski prism) may be configured to receive the illumination beam 101 and shear the illumination beam 101 into two beamlets 105a, 105b along a defined shearing direction. For example, as shown in FIGS. 3 and 4, the first beamlet 105a ("0-beam") and the second beamlet 105b ("e-beam") may diverge after exiting the shearing prism 130. As noted previously herein, when the optical metrology sub-system 102a is configured to perform shearing interferometry (e.g., "shearing mode"), the half-wave plate 108 may be configured to direct the illumination beam 101 to the prism chuck 110 such that the first beamlet 105a and the second beamlet 105b exhibit equal intensities. Conversely, during a Fizeau-only mode, as will be discussed in further detail herein, the shearing prism 130 may be replaced by a quarter-wave plate to provide a single illumination beam on the sample 103 and ensure that the reflected illumination passes through the beamsplitter 106.

The nomenclature of the beamlets 105a, 105b may also be dependent upon the polarization angle of each beamlet 105a, 105b with respect to the optical axis 131a-131d. When the polarization direction of a beamlet 105 exiting a shearing prism 130 is parallel to the optical axis 131b, 131d of the shearing prism 130, the beam let 105 may be referred to as an extra-ordinary beam ("e-beam"). The e-beam is illustrated as beamlet 105a in FIGS. 3 and 4, and exhibits a polarization which is orthogonal to the surface of the page. Conversely, when the polarization direction of a beamlet 105 exiting a shearing prism 130 is perpendicular to the crystal axis 131b, 131d of the shearing prism 130, the beam let 105 may be referred to as an ordinary beam ("0-beam"). The o-beam is illustrated as beamlet 105b in FIGS. 3 and 4, and exhibits a polarization which is parallel to the surface of the page.

Figure 5:
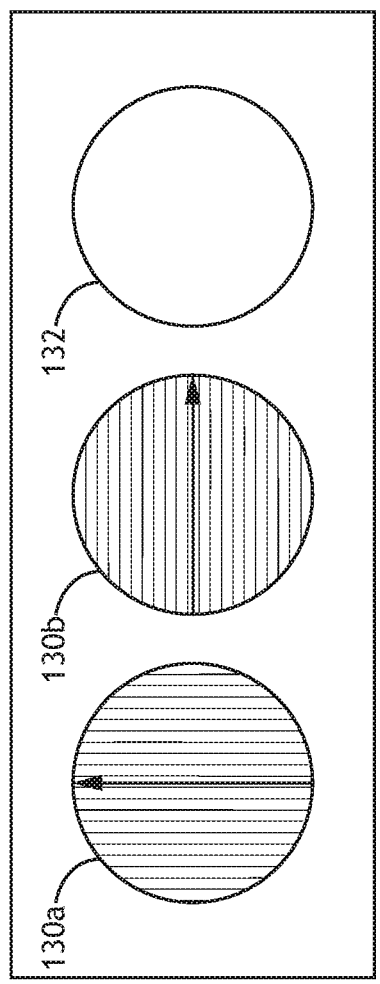
FIG. 5 illustrates a prism chuck including one or more shearing prisms, in accordance with one or more embodiments of the present disclosure.

FIG. 5 illustrates a prism chuck 110 including one or more shearing prisms 130a, 130b in accordance with one or more embodiments of the present disclosure. The prism chuck 110 may facilitate switching between operational modes (e.g., Fizeau and shearing modes) as well as selecting a measurement direction for shearing mode operation. In one embodiment, as illustrated in FIG. 5, the prism chuck 110 may include one or more mounting slots to secure various optics including, but not limited to, one or more shearing prisms 130 with fixed orientations or one or more waveplates (e.g., a quarter-wave plate, or the like). In another embodiment, though not shown, the prism chuck 110 may include one or more rotational stages suitable for rotating one or more optics.

In shearing interferometry (e.g., shearing mode), the illumination beam 101 may be sheared along various defined shearing directions in order to measure a slope of a sample (e.g., sample 103) along the defined direction. For example, the illumination beam 101 may be sheared into two beamlets 105a, 105b separated along a vertical shearing direction in order to measure surface slope of the sample 103 along the vertical direction. By way of another example, the illumination beam 101 may be sheared into two beamlets 105a, 105b separated along a horizontal shearing direction in order to measure surface slope of the sample 103 along the horizontal direction.

Accordingly, the prism chuck 110 may facilitate switching between vertical and horizontal shearing measurements. In one embodiment, as illustrated in FIG. 5, the prism chuck 110 includes a first shearing prism 130 oriented to provide shearing along a vertical direction and a second shearing prism 130 oriented to provide shearing along the horizontal direction. In this regard, the optical metrology sub-system may provide vertical shearing measurements by translating the prism chuck 110 such that the first shearing prism 130 is in the optical path and may provide horizontal shearing measurements by translating the prism chuck 110 such that the second shearing prism 130 is in the optical path. In another embodiment, though not shown, the prism chuck 110 includes a rotational mount to rotate a single shearing prism 130 to a selected orientation (e.g., vertical or horizontal). Further, the prism chuck 110 may be actuated (e.g., translated and/or rotated) by any technique known in the art. In one embodiment, the prism chuck 110 is actuated by one or more control signals from the controller 122.

In some embodiments, the prism chuck 110 may include one or more non-shearing optical elements 132 which are not configured to shear the illumination beam 101. In this regard, the non-shearing optical elements 132 may be utilized in a Fizeau-only mode. For example, as shown in FIG. 3, the prism chuck 110 may include an optic which is configured to not shear the illumination beam 101. The one or more non-shearing optical elements 132 may include any non-shearing optical elements known in the art. In one embodiment, the non-shearing optical elements 132 includes a quarter-wave plate. For example, light polarized at a 45-degree angle with respect to a fast axis of a quarter-wave plate to provide circularly-polarized illumination on the sample 103 and linearly-polarized illumination oriented to propagate through the polarizing beamsplitter 106 towards the detector assembly 120.

Referring again generally to FIGS. 2A through 5, OPD tuning for generating multiple interferograms with shifted interference fringes and corresponding phase retrieval algorithms will be described in greater detail. In a general sense, the optical metrology sub-system 102 may implement OPD tuning using any technique known in the art.

In some embodiments, OPD tuning is implemented by mechanically actuating one or more components of the optical metrology sub-system 102. In one embodiment, the OPD associated with Fizeau fringes is tuned by translating the reference flat 114 to vary the distance between the reference flat 114 and the sample 103.

In another embodiment, the OPD associated with shearing fringes is tuned by laterally translating the shearing prism 130 (e.g., by translating the shearing prism along the vertical direction in FIGS. 3 and 4). As noted previously herein, interferometric measurement techniques are dependent upon interaction and phase shifts between the beamlets 105a, 105b. These phase shifts between beamlets 105a, 105b may depend upon the optical path length or optical path difference (OPD) of the respective beamlets 105a, 105b throughout the optical metrology sub-system 102a. In particular, the OPD between the e-beam (beamlet 105a) and the o-beam (beamlet 105b) may be dependent on the amount of material of the shearing prism 130a through which the e-beam propagates. In this regard, the OPD between the e-beam and o-beam, and therefore the phase difference between the two, may be adjusted by actuating the shearing prism 130. In this regard, during a shearing mode, tuning the optical metrology sub-system 102 may be achieved by actuating the shearing prism 130 in a lateral direction orthogonal to the path of the illumination beam 101/beamlets 105a, 105b.

For example, the OPD of the beamlets 105a, 105b through the Rochon prism 134 (e.g., shearing prism 130) depicted in FIG. 4 may be defined by Equation 1:

$$OPD = n_e l_e - n_o l_o \quad (1)$$

wherein OPD is the optical path difference of the shearing prism 130, $n_o$ is the refractive index of the shearing prism 130 along the ordinary axis, $n_e$ is refractive index of the shearing prism 130 along the extraordinary axis, and $l_o$ and $l_e$ are defined by Equation 2 and Equation 3, respectively:

$$l_o = d^* \tan(90-\theta) \quad (2)$$

$$l_e = l_o/\cos(\delta') \quad (3)$$

Substituting Equation 2 and Equation 3 into Equation 1 yields Equation 4:

$$OPD = d^* \tan(90-\theta)[n_e/\cos(\delta') - n_o]\delta \quad (4)$$

As may be seen in Equation 4, the optical distance of the Rochon prism 134 (e.g., polarizing prism 130) may be linearly proportional to d, where d is the distance between an edge of the Rochon prism 134 (e.g., polarizing prism 130) and a plane of the illumination beam 101 incident upon the Rochon prism 134 (e.g., polarizing prism 130). In this regard, the OPD is proportional to the lateral position of the Rochon prism 134 with respect to the incidence plane of the illumination beam 101 on the shearing prism 130. Accordingly, during a shearing mode, the optical metrology sub-system 102 may perform tuning by actuating the prism chuck 110/shearing prisms 130, via the controller 122, in a lateral direction orthogonal to the path of the illumination beam 101 (e.g., up and down in FIGS. 3 and 4) in order to tune the phase shift between the beamlets 105a, 105b.

Table 1 below illustrates a relationship between variables of a Quartz-material Rochon prism 134. Accordingly, Table 1 illustrates the relationship between variables in Equations 1-4 above. In particular, Table 1 illustrates how actuating the prism chuck 110/shearing prisms 130 may induce phase shifts between the beamlets 105a, 105b in order to carry out tuning during a shearing mode.

TABLE 1

| Tuning With Lateral Actuation of Shearing Prism | | |
|---|---|---|
| d | e - beam OPD | Phase Shift (in waves) |
| 25.4 | 0.011044 | 0 |
| 26.4 | 0.011478 | 0.68042 |
| 27.4 | 0.011913 | 1.36084 |
| 28.4 | 0.012348 | 2.04126 |

As may be seen in Table 1 above, laterally actuating the prism chuck 110/shearing prism 130 in a direction orthogonal to the path of the illumination beam 101 by 2 mm (e.g., Δd=2) may result in a phase shift between beamlet 105a and beamlet 105b of approximately 1.3 waves. Phase shifts of one wave or more are typically required for robust phase shifting algorithms.

In another embodiment, the OPDs of Fizeau and/or shearing fringes may be tuned by adjusting (e.g., sweeping) the wavelength of the illumination beam 101 generated by the illumination source 104. For example, the phase shifts within the illumination 107 detected by the detector assembly 120 associated with both Fizeau and shearing fringes may depend upon the wavelength of the illumination beam 101 generated by the illumination source 104.

However, it is contemplated herein that the rate at which interference fringes shift as the wavelength of the illumination beam 101 is tuned (e.g., swept) may differ between the Fizeau and sharing modes. This difference may be exploited to differentiate the contributions of Fizeau fringes and shearing fringes when both are present in the illumination 107 captured by the detector assembly 120 (e.g., when beamlets 105a, 105b are formed and the reference flat 114 is in the optical path). For example, if the wavelength of the illumination beam 101 is tuned at a constant rate, Fizeau and shearing fringes may be differentiated based on the relative shift rates. By way of another example, the wavelength of the illumination source 101 may be sequentially tuned at different rates to provide desired sampling of the interference fringe shifts associated with the Fizeau and shearing modes by the detector assembly 120.

Further, any number or combination of phase retrieval algorithms may be used to extract data associated with the sample 103 from multiple interferograms generated by OPD tuning. In one embodiment, if only Fizeau fringes are generated, the controller 122 may implement a phase retrieval algorithm suitable for extracting surface height data from the interferograms. In another embodiment, if only shearing fringes are generated, the controller 122 may implement a phase retrieval algorithm suitable for extracting surface slope data from the interferograms. In another embodiment, if both Fizeau and shearing fringes are generated, the controller 122 may implement one or more phase retrieval algorithms to extract both the surface height and slope data from the interferograms. For instance, the controller 122 may first isolate the contributions of the Fizeau and shearing fringes and may then apply separate phase retrieval algorithms. In another instance, the controller may apply a single phase retrieval algorithm to simultaneously extract the surface height and slope data.

It is contemplated herein that there may be several tradeoffs associated with operating the optical metrology sub-system 102a individually as either a Fizeau or shearing interferometer (e.g., Fizeau mode or shearing mode), or simultaneously as both a joint Fizeau/shearing interferometer (e.g., dual Fizeau/shearing mode). For example, it is noted herein that the phase retrieval algorithm required to perform simultaneous surface height measurements and surface slope measurements may be more complex than the phase retrieval algorithms required for retrieving the surface height and surface slope measurements individually. Accordingly, processing power limitations in a particular application may be a factor in determining which mode or modes to implement. By way of another example, performing simultaneous measurements in dual Fizeau/shearing modes may improve throughput. Furthermore, it is contemplated herein that practical limitations of sample 103 surface heights and wide variability of structures on a sample 103 may further impact the measurement accuracy in any of the operational modes.

In another embodiment, the one or more processors 124 may be configured to store the determined surface height measurements and determined surface slope measurements in memory 126. In another embodiment, the one or more processors 124 may be configured to determine/measure one or more additional characteristics of the sample 103 based upon the determined surface height and/or surface slope measurements. For example, the one or more processors 124 may be configured to measure a global and/or local stress value of the sample 103 based on the determined surface height and/or surface slope measurements. In this regard, embodiments of the present disclosure may be used to measure/determine global/local stress of patterned and unpatterned samples 103 attributable to deposition of thin films, chemical-mechanical polishing, or other fabrication processes.

It is to be understood that FIGS. 2A and 2B, along with the associated description, is provided solely for illustrative purposes and should not be interpreted as limiting. The optical metrology sub-system may be implemented in multiple configurations within the spirit and scope of the present disclosure.

Figure 2C:
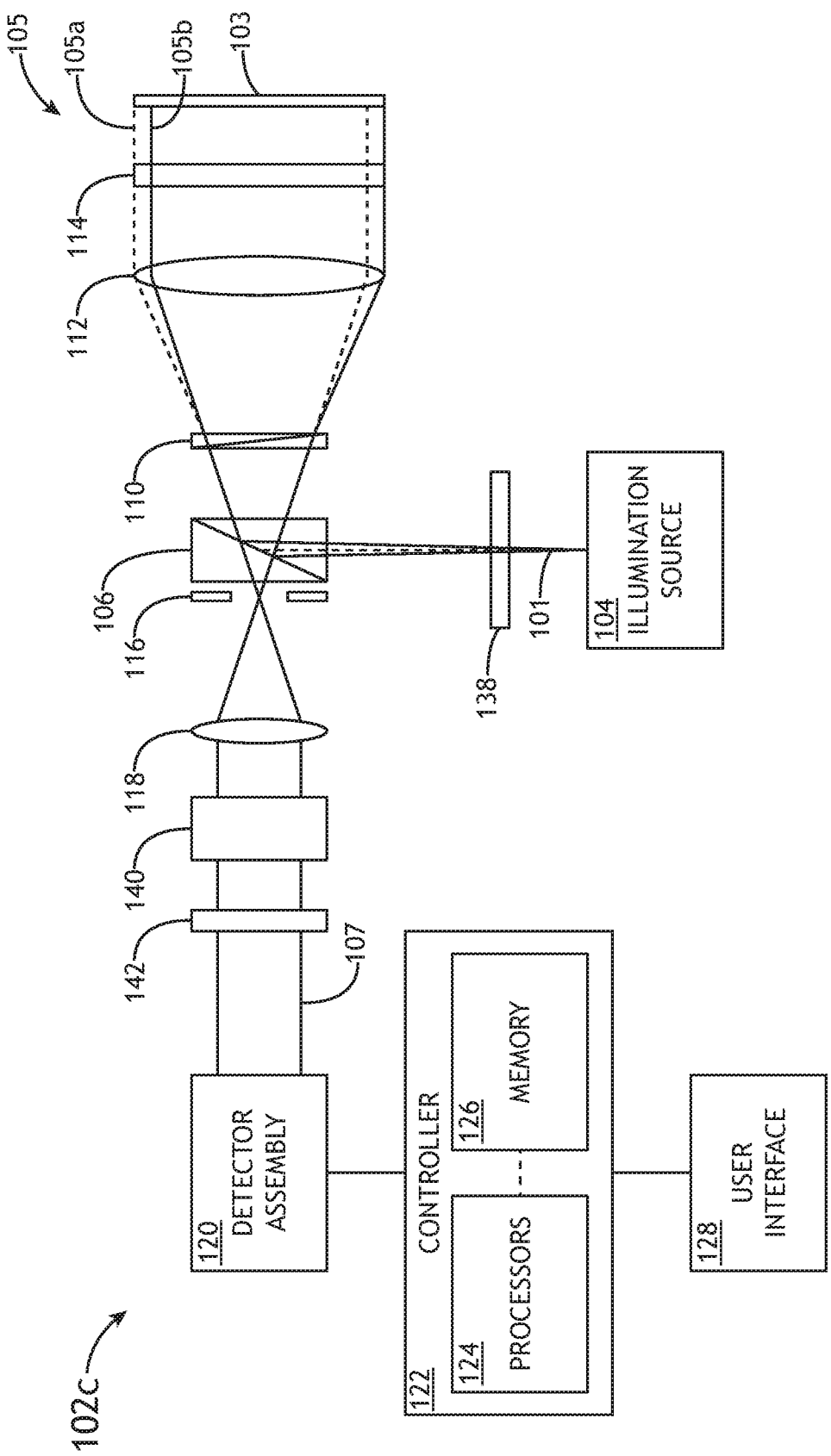
FIG. 2C illustrates a simplified block diagram of an optical metrology sub-system of an interferometry system, in accordance with one or more embodiments of the present disclosure.

FIG. 2C illustrates a simplified block diagram of an optical metrology sub-system 102c of an interferometry system, in accordance with one or more embodiments of the present disclosure. It is noted herein that any description associated with the optical metrology sub-system 102c depicted in FIG. 2C may be regarded as applying to the optical metrology sub-systems 102a-102b depicted in FIGS. 2A-2B, unless noted otherwise herein.

In some embodiments, the optical metrology sub-system 102 may include two or more polarizers to perform the at least some of the functions of the polarizing beamsplitter 106 and the half-wave plate 108 depicted in FIGS. 2A-2B. For example, as shown in FIG. 2C, the optical metrology sub-system 102c may include a polarizer 138 and a polarizer 142 (e.g., analyzer 142). In one embodiment, the polarizer 138 oriented at a 45° angle in order to induce a 45° polarization of the illumination beam 101 on a fast or slow axis of the shearing prism 130. Alternately, the shearing prism 130 may be oriented with a fast or slow axis at a 45° angle with respect to the polarization direction of the polarizer 138. As noted previously herein with respect to the half-wave plate 108, the polarizer 138 may be configured to induce a 45° polarization in order to ensure the shearing prisms 130a, 130b result in equal intensities between the e-beam (beamlet 105a) and the o-beam (beamlet 105b). In another embodiment, the analyzer 142 is oriented 90° with respect to the polarizer 138. The analyzer 142 is configured to receive the illumination 107 reflected from the surface of the sample 103 and direct the illumination 107 to the detector assembly 120.

With embodiments including polarizer 138 and analyzer 142, it is contemplated herein that the optical metrology sub-system 102 may not require a polarizing beam splitter. Accordingly, the beam splitter 106 illustrated in FIG. 2C may include a non-polarizing beam splitter 106.

In another embodiment, the optical metrology sub-system 102c may include a phase retardation plate 140. For example, as shown in FIG. 2C, the phase retardation plate 140 may be disposed between the beam splitter 106 and the analyzer 142. As discussed previously herein, tuning the wavelength of the illumination beam 101 in a controlled fashion may induce a known amount of phase shift between the beamlets 105a, 105b. However, it is further noted herein that a phase retardation plate 140 may be required to achieve the requisite phase shift if the tunable wavelength changes are not sufficiently wide. Accordingly, the phase retardation plate 140 may be used to facilitate wavelength tuning. The phase retardation plate 140 may exhibit varying refractive indexes in the slow and fast axis. Accordingly, varying the wavelength of the illumination beam 101 (wavelength tuning) may result in changing the optical path length/optical distance (OPD) within the phase retardation plate 140 without mechanically actuating any components of the optical metrology sub-system 102c. In one embodiment, the OPD of the phase retardation plate 140 may perform similarly to the cavity length in a Fizeau interferometer.

In one embodiment, the thickness L of the phase retardation plate 140 is required to match the tunable range of the illumination source 104 for the amount of phase shifting required. The material of the phase retardation plate 140 may also affect the thickness L of the phase retardation plate 140 which is required to obtain a particular phase shift. The phase retardation plate 140 may be formed from any material known in the art including, but not limited to, Calcite, Quartz, and the like. For example, for a tunable illumination source 104 range of 300 pm, the phase retardation plate 140 may be required to exhibit an OPD of approximately 1.36 mm in order to induce a $2\pi$ phase shift, thereby requiring approximately 8 mm of a Calcite birefringence material (e.g., thickness L=8 mm). In general, the larger the tunable range of the illumination source 104, the thinner the phase retardation plate 140 may be required.

In an alternative embodiment, the optical metrology sub-system 102c may include a variable retardation plate (not shown). In some embodiments, the variable retardation plate may be used in place of the phase retardation plate 140 in order to induce a phase shift between the beamlets 105a, 105b. The variable retardation plate may include any variable retardation plate known in the art including, but not limited to, a Pockels cell, a liquid crystal variable retarder (LCVR), and the like. In one embodiment, the slow-axis refractive index of the variable retarder, and therefore the OPD difference between the e-beam (beamlet 105a) and the o-beam (beamlet 105c), may be modulated by controlling the voltage applied to the variable retardation plate. Accordingly, the controller 122 may be configured to induce a phase shift in the beamlets 105a, 105b by selectively adjusting and/or modulating a voltage applied to a variable retardation plate.

In another embodiment, in the case of a coherent illumination source 104 (e.g., a laser source, or the like), the shearing prism 130 may be located between the beamsplitter 106 and the analyzer 142 in addition to or instead of the retardation plate 140.

It is noted herein that varying configurations of the optical metrology sub-system 102a-102c may be used on opposing sides of the sample 103. For example, in one configuration, the optical metrology sub-system 102b illustrated in FIG. 2B may be configured to measure the surface slope of a first, patterned surface of the sample 103. Continuing with the same example, the optical metrology sub-system 102a illustrated in FIG. 2A may be configured to measure the surface height of a second, unpatterned surface of the sample 103. It is contemplated herein that any combination of configurations of the optical metrology sub-system 102 may be used to measure various characteristics of diametrically opposing surfaces of a sample 103.

It is noted herein that the one or more components of the optical metrology sub-system 102a-102c may be communicatively coupled to the various other components of the system in any manner known in the art. For example, the illumination source 104, detector assembly 124, actuators (not shown), controller 122, and user interface 128 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth, 3G, 4G, 4G LTE, 5G and the like).

In one embodiment, the controller 122 of optical metrology sub-system 102a-102c includes one or more processors 124 and memory 126. In another embodiment, the one or more processors 124 may be configured to execute a set of program instructions stored in memory 126, wherein the set of program instructions are configured to cause the one or more processors 124 to carry out the steps of the present disclosure In one embodiment, the one or more processors 124 may include any one or more processing elements known in the art. In this sense, the one or more processors 124 may include any microprocessor-type device configured to execute software algorithms and/or instructions. In one embodiment, the one or more processors 124 may consist of a desktop computer, mainframe computer system, workstation, image computer, parallel processor, or other computer system (e.g., networked computer) configured to execute a program configured to operate the optical metrology sub-system 102a-102c as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 124. In general, the term "processor" may be broadly defined to encompass any device having one or more processing elements, which execute program instructions from memory 126. Moreover, different subsystems of the optical metrology sub-system 102a-102c (e.g., illumination source 104, detector assembly 124, actuators (not shown), controller 122, and user interface 128) may include processor or logic elements suitable for carrying out at least a portion of the steps described throughout the present disclosure. Therefore, the above description should not be interpreted as a limitation on the present disclosure but merely an illustration.

The memory 126 may include any storage medium known in the art suitable for storing program instructions executable by the associated one or more processors 124. For example, the memory 126 may include a non-transitory memory medium. For instance, the memory 126 may include, but is not limited to, a read-only memory (ROM), a random access memory (RAM), a magnetic or optical memory device (e.g., disk), a magnetic tape, a solid state drive and the like. It is further noted that memory 126 may be housed in a common controller housing with the one or more processors 124. In an alternative embodiment, the memory 126 may be located remotely with respect to the physical location of the processors 124, controller 122, and the like. In another embodiment, the memory 126 maintains program instructions for causing the one or more processors 124 to carry out the various steps described through the present disclosure.

In one embodiment, a user interface 128 is communicatively coupled to the controller 122. In one embodiment, user interface 128 may include, but is not limited to, one or more desktops, tablets, smartphones, smart watches, or the like. In another embodiment, the user interface 128 includes a display used to display data of the optical metrology sub-system 102a-102c to a user. The display of the user interface may include any display known in the art. For example, the display may include, but is not limited to, a liquid crystal display (LCD), an organic light-emitting diode (OLED) based display, or a CRT display. Those skilled in the art should recognize that any display device capable of integration with a user interface 128 is suitable for implementation in the present disclosure. In another embodiment, a user may input selections and/or instructions responsive to data displayed to the user via the user interface 128.

Figure 6:
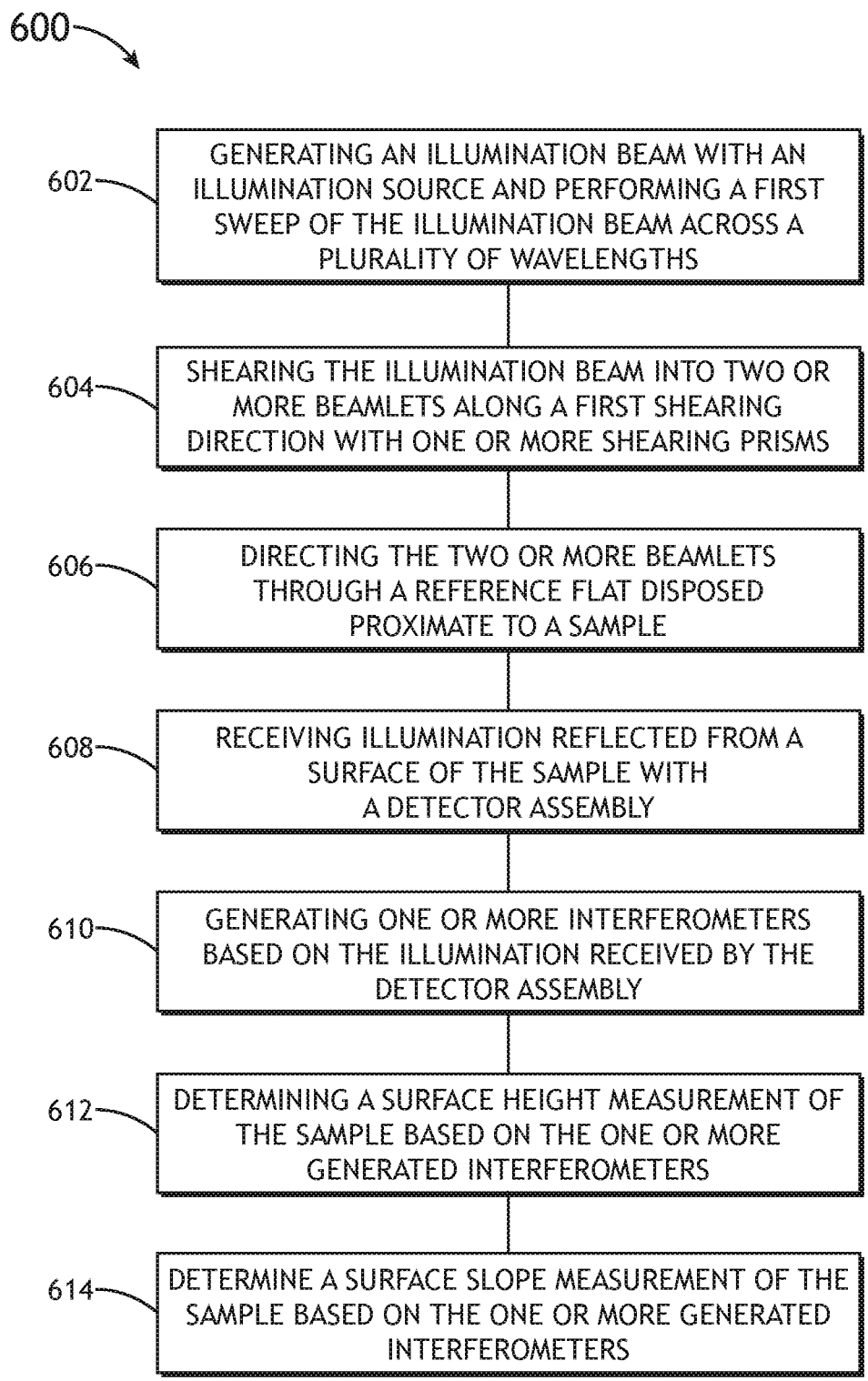
FIG. 6 illustrates a flowchart for a method of measuring characteristics of a sample with an interferometer system, in accordance with one or more embodiments of the present disclosure.

FIG. 6 illustrates a flowchart for a method 600 of measuring characteristics of a sample with an interferometer system, in accordance with one or more embodiments of the present disclosure. It is noted herein that the steps of method 600 may be implemented all or in part by interferometry system 100. It is further recognized, however, that the method 600 is not limited to the interferometry system 100 in that additional or alternative system-level embodiments may carry out all or part of the steps of method 600.

In step 602, an illumination beam is generated with an illumination source, and a first sweep of the illumination beam is performed across a plurality of wavelengths. For example, the controller 122 may be configured to cause the illumination source 104 to generate an illumination beam 101 and sweep the illumination beam 101 across a plurality of wavelengths. The illumination source 104 may include any illumination source known in the art including, but not limited to, a broadband illumination source (e.g., discharge lamp, laser-sustained plasma (LSP) source), a narrowband illumination source (e.g., a laser source), and the like. For example, the illumination source 104 may include a tunable laser illumination source or a light emitting diode (LED).

In a step 604, the illumination beam is sheared into two beamlets along a first shearing direction with one or more shearing prisms. For example, a prism chuck 110 may include a first shearing prism 130a and a second shearing prism 130b. The first shearing prism 130a may be configured to shear the illumination beam 101 into two beamlets 105a, 105b along a first shearing direction (e.g., a vertical direction) in order to measure surface slope of the sample 103 along the vertical direction. By way of another example, the second shearing prism 130b may be configured to shear the illumination beam 101 into two beamlets 105a, 105b along a second shearing direction (e.g., a horizontal direction) in order to measure surface slope of the sample 103 along the horizontal direction.

In a step 606, the two beamlets are directed through a reference flat disposed proximate to a sample. For example, the two beamlets 105a, 105b may be directed through a reference flat 114 disposed proximate to the sample 103. For example, the reference flat 114 may include a small wedge optical plate with a reference surface facing the sample 103. The wedge surface of the reference flat 114 may be configured to deflect reflection illumination from the wedge surface such that reflected illumination is not captured by the detector assembly 120. As noted previously herein, interference between a portion of the illumination beam 101 reflected from the sample 103 and a portion of the illumination beam 101 reflected from the reference flat 114 may induce a phase difference indicative of surface topology of the sample 103.

In a step 608, illumination reflected from a surface of the sample is received with a detector assembly. For example, beamlets 105a, 105b reflected from the surface of the sample 103 are merged back into a single illumination beam as they propagate to the detector assembly 120, wherein the single beam includes two orthogonal polarizations offset by a phase shift. The detector assembly 120 may include any detector assembly known in the art including, but not limited to, a pixelated detector, a charge coupled device (CCD) detector, a complementary metal-oxide-semiconductor (CMOS) detector, a shearing camera, and the like. As noted previously herein, phase differences between the beamlets 105a, 105b reflected from the surface of the sample 103 may include data which is indicative of surface slope of the sample 103.

In a step 610, one or more interferograms are generated based on the illumination received by the detector assembly associated with the plurality of wavelengths. For example, the detector assembly 120 may be configured to generate one or more interferograms based on the received illumination 107. The generated interferograms may be stored in memory 126.

In a step 612, a surface height measurement of the sample is determined based on the illumination received by the detector assembly. In one embodiment, the surface height measurement is based on interference of the two beamlets between the reference flat and the sample. For example, the one or more processors 124 may be configured to determine a phase shift using one or more phase retrieval algorithms, and determine a surface height measurement based on the identified phase shift.

In a step 614, a surface slope measurement of the sample is determined based on the illumination received by the detector assembly. In one embodiment, the surface slope measurement is based on interference between the two beamlets reflected from the surface of the sample. For example, the one or more processors 124 of the controller 122 may be configured to utilize one or more phase retrieval algorithms in order to determine: (1) phase shifts attributable to interference between a portion of the illumination beam 101 reflected from the sample 103, and a portion of the illumination beam 101 reflected from the reference flat 114 (Fizeau interferometry), and (2) phase shifts attributable to interference between the beamlets 105a, 105b reflected from the surface of the sample 103 (shearing interferometry). The one or more processors 124 may then be configured to use the one or more determined phase shifts to determine the one or more surface height measurements and/or the one or more surface slope measurements.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An interferometer system, comprising:
a stage assembly configured to receive and secure a sample;
one or more optical metrology sub-systems comprising:
an illumination source configured to generate an illumination beam;
a polarizing beamsplitter configured to pass at least a portion of the illumination beam having a selected polarization direction;
a half-wave plate;
a shearing prism configured to shear the illumination beam into two beamlets along a shearing direction, wherein the half-wave plate is configured to adjust a polarization of the illumination beam on the shearing prism;
a reference flat disposed proximate to the sample; and
a detector assembly configured to receive illumination reflected from a surface of the sample that propagates back through the shearing prism and the half-wave plate and is further passed by the polarizing beamsplitter; and
a controller including one or more processors and a memory, the one or more processors configured to execute a set of program instructions stored in memory, the set of program instructions configured to cause the one or more processors to:
generate one or more control signals to cause the illumination source to sweep the illumination beam across a plurality of wavelengths;
determine a surface height measurement of the sample based on the illumination received by the detector assembly, wherein the surface height measurement is based on interference of a portion of the illumination beam reflected from the sample and a portion of the illumination beam reflected from a surface of the reference flat associated with the plurality of wavelengths; and
determine a surface slope measurement of the sample along the shearing direction based on the illumination received by the detector assembly, wherein the surface slope measurement is based on interference between the two beamlets reflected from the surface of the sample associated with the plurality of wavelengths.

2. The interferometer system of claim 1, wherein the determination of the surface height measurement and the determination of the surface slope measurement are based on a single sweep of the illumination beam.

3. The interferometer system of claim 1, wherein the determination of the surface height measurement and the determination of the surface slope measurement are based on sequential sweeps of the illumination beam.

4. The interferometer system of claim 3, wherein the determination of the surface height measurement and the determination of the surface slope measurement are performed with a common arrangement of the half-wave plate, the shearing prism, and the reference flat.

5. The interferometer system of claim 3, further comprising:
a prism chuck securing the shearing prism and a quarter-wave plate, wherein the set of program instructions are configured to cause the one or more processors to determine the surface height measurement of the sample based on the illumination received by the detector assembly by:
generating one or more control signals to actuate the prism chuck such that the shearing prism is out of an optical path of the illumination beam and the quarter-wave plate is in the optical path, wherein the quarter-wave plate is oriented to pass the illumination reflected from the sample through the polarizing beamsplitter to the detector assembly;
generating one or more control signals to cause the illumination source to perform a first sweep of the illumination beam across a plurality of wavelengths; and
determining the surface height measurement of the sample based on the illumination received by the detector assembly associated with the first sweep of the illumination beam.

6. The interferometer system of claim 5, wherein the set of program instructions are configured to cause the one or more processors to determine the surface slope measurement of the sample based on the illumination received by the detector assembly by:
generating one or more control signals to actuate the prism chuck such that the shearing prism is in the optical path and the quarter-wave plate is out of the optical path;
generating one or more control signals to cause the illumination source to perform a second sweep of the illumination beam across a plurality of wavelengths; and
determining the surface slope measurement of the sample based on the illumination received by the detector assembly associated with the second sweep of the illumination beam.

7. The interferometer system of claim 6, further comprising:
a chuck securing the reference flat, wherein the set of program instructions are further configured to cause the one or more processors to:
generate one or more control signals to actuate the chuck securing the reference flat such that the reference flat is out of the optical path of the illumination beam prior to generating one or more control signals to cause the illumination source to perform a first sweep of the illumination beam across a plurality of wavelengths.

8. The interferometer system of claim 1, wherein determining a surface height measurement of the sample and a surface slope measurement of the sample based on the illumination received by the detector assembly comprises:
determining the surface height measurement of the sample with a first phase retrieval algorithm, and determining the surface slope measurement of the sample with a second phase retrieval algorithm different from the first phase retrieval algorithm.

9. The interferometer system of claim 1, further comprising:
a rotational stage securing the shearing prism, wherein the set of program instructions is further configured to cause the one or more processors to:
generate one or more control signals to rotate the shearing prism to provide the two beamlets along a second shearing direction orthogonal to the shearing direction;
generate one or more control signals to cause the illumination source to perform an additional sweep of the illumination beam across a plurality of wavelengths; and determine an additional surface slope measurement of the sample along the second shearing direction based on the illumination received by the detector assembly in response to the additional sweep.

10. The interferometer system of claim 1, further comprising:
a prism chuck securing the shearing prism and an additional shearing prism configured to shear the illumination beam into two beamlets along a second shearing direction orthogonal to the shearing direction, wherein the set of program instructions is further configured to cause the one or more processors to:
generate one or more control signals to actuate the prism chuck such that the additional shearing prism is in an optical path of the illumination beam;
generate one or more control signals to cause the illumination source to perform an additional sweep of the illumination beam across a plurality of wavelengths; and
determine an additional surface slope measurement of the sample along the second shearing direction based on the illumination received by the detector assembly in response to the additional sweep.

11. The interferometer system of claim 1, wherein the one or more optical metrology sub-systems comprise a first optical metrology sub-system configured to determine one or more measurements on a first surface of the sample, and a second optical metrology sub-system configured to determine one or more measurements on a second surface of the sample opposite the first surface.

12. The interferometer system of claim 11, further comprising a holding mechanism configured to hold the sample substantially vertically.

13. The interferometer system of claim 1, wherein the shearing prism comprises at least one of a Rochon prism, a Wollaston prism, or a Nomarski prism.

14. The interferometer system of claim 1, wherein the illumination source comprises a tunable laser illumination source.

15. The interferometer system of claim 1, wherein the illumination source comprises a broadband illumination source.

16. An interferometer system, comprising:
a stage assembly configured to receive and secure a sample;
one or more optical metrology sub-systems comprising:
an illumination source configured to generate an illumination beam;
a polarizer configured to pass at least a portion of the illumination beam;
a non-polarizing beamsplitter;
a shearing prism oriented to shear the illumination beam into two beamlets along a shearing direction;
a reference flat disposed proximate to the sample;
an analyzer having a polarization direction crossed with respect to the polarizer; and
a detector assembly configured to receive illumination reflected from a surface of the sample that propagates back through the shearing prism, the non-polarizing beamsplitter, and the analyzer; and
a controller including one or more processors and a memory, the one or more processors configured to execute a set of program instructions stored in memory, the set of program instructions configured to cause the one or more processors to:
generate one or more control signals to cause the illumination source to sweep the illumination beam across a plurality of wavelengths;
determine a surface height measurement of the sample based on the illumination received by the detector assembly, wherein the surface height measurement is based on interference of a portion of the illumination beam reflected from the sample and a portion of the illumination beam reflected from a surface of the reference flat associated with the plurality of wavelengths; and
determine a surface slope measurement of the sample based on the illumination received by the detector assembly, wherein the surface slope measurement is based on interference between the two beamlets reflected from the surface of the sample associated with the plurality of wavelengths.

17. The interferometer system of claim 16, further comprising a phase retardation plate, wherein the phase retardation plate is configured to receive illumination reflected from the surface of the sample and induce a phase shift between beamlets of the received illumination.

18. The interferometer system of claim 16, further comprising a variable retardation plate configured to receive illumination reflected from the surface of the sample and apply a voltage to the received illumination in order to induce a phase shift between beamlets of the received illumination.

19. The interferometer system of claim 18, wherein the variable retardation plate comprises at least one of a Pockels cell or a liquid crystal variable retarder (LCVR).

20. The interferometer system of claim 16, wherein the determination of the surface height measurement and the determination of the surface slope measurement are based on a single sweep of the illumination beam.

21. The interferometer system of claim 16, wherein the determination of the surface height measurement and the determination of the surface slope measurement are based on sequential sweeps of the illumination beam.

22. The interferometer system of claim 21, wherein the determination of the surface height measurement and the determination of the surface slope measurement are performed with a common arrangement of the shearing prism and the reference flat.

23. The interferometer system of claim 21, further comprising:
a prism chuck securing the shearing prism and a quarter-wave plate, wherein the set of program instructions are configured to cause the one or more processors to determine the surface height measurement of the sample based on the illumination received by the detector assembly by:
generating one or more control signals to actuate the prism chuck such that the shearing prism is out of an optical path of the illumination beam and the quarter-wave plate is in the optical path, wherein the quarter-wave plate is oriented to pass the illumination reflected from the sample through the polarizing beamsplitter to the detector assembly;
generating one or more control signals to cause the illumination source to perform a first sweep of the illumination beam across a plurality of wavelengths; and
determining the surface height measurement of the sample based on the illumination received by the detector assembly associated with the first sweep of the illumination beam.

24. The interferometer system of claim 23, wherein the set of program instructions are configured to cause the one or more processors to determine the surface slope measurement of the sample based on the illumination received by the detector assembly by:
  generating one or more control signals to actuate the prism chuck such that the shearing prism is in the optical path and the quarter-wave plate is out of the optical path;
  generating one or more control signals to cause the illumination source to perform a second sweep of the illumination beam across a plurality of wavelengths; and
  determining the surface slope measurement of the sample based on the illumination received by the detector assembly associated with the second sweep of the illumination beam.

25. The interferometer system of claim 24, further comprising:
  a chuck securing the reference flat, wherein the set of program instructions are further configured to cause the one or more processors to:
  generate one or more control signals to actuate the chuck securing the reference flat such that the reference flat is out of the optical path of the illumination beam prior to generating one or more control signals to cause the illumination source to perform a first sweep of the illumination beam across a plurality of wavelengths.

26. The interferometer system of claim 16, wherein determining a surface height measurement of the sample and a surface slope measurement of the sample based on the illumination received by the detector assembly comprises:
  determining the surface height measurement of the sample with a first phase retrieval algorithm, and determining the surface slope measurement of the sample with a second phase retrieval algorithm different from the first phase retrieval algorithm.

27. The interferometer system of claim 16, further comprising:
  a rotational stage securing the shearing prism, wherein the set of program instructions is further configured to cause the one or more processors to:
  generate one or more control signals to rotate the shearing prism to provide the two beamlets along a second shearing direction orthogonal to the shearing direction;
  generate one or more control signals to cause the illumination source to perform an additional sweep of the illumination beam across a plurality of wavelengths; and
  determine an additional surface slope measurement of the sample along the second shearing direction based on the illumination received by the detector assembly in response to the additional sweep.

28. The interferometer system of claim 16, further comprising:
  a prism chuck securing the shearing prism and an additional shearing prism configured to shear the illumination beam into two beamlets along a second shearing direction orthogonal to the shearing direction, wherein the set of program instructions is further configured to cause the one or more processors to:
  generate one or more control signals to actuate the prism chuck such that the additional shearing prism is in an optical path of the illumination beam;
  generate one or more control signals to cause the illumination source to perform an additional sweep of the illumination beam across a plurality of wavelengths; and
  determine an additional surface slope measurement of the sample along the second shearing direction based on the illumination received by the detector assembly in response to the additional sweep.

29. The interferometer system of claim 16, wherein the one or more optical metrology sub-systems comprise a first optical metrology sub-system configured to determine one or more measurements on a first surface of the sample, and a second optical metrology sub-system configured to determine one or more measurements on a second surface of the sample opposite the first surface.

30. The interferometer system of claim 29, further comprising a holding mechanism configured to hold the sample substantially vertically.

31. The interferometer system of claim 16, wherein the shearing prism is oriented to provide equal intensities between the two beamlets.

32. The interferometer system of claim 16, wherein the shearing prism comprises at least one of a Rochon prism, a Wollaston prism, or a Nomarski prism.

33. The interferometer system of claim 16, wherein the illumination source comprises a tunable laser illumination source.

34. The interferometer system of claim 16, wherein the illumination source comprises a broadband illumination source.

35. A method comprising:
  generating an illumination beam with an illumination source and performing a sweep of the illumination beam across a plurality of wavelengths;
  shearing the illumination beam into two beamlets along a shearing direction with one or more shearing prisms;
  directing the two beamlets through a reference flat disposed proximate to a sample;
  receiving illumination reflected from a surface of the sample with a detector assembly;
  generating one or more interferograms based on the illumination received by the detector assembly;
  determining a surface height measurement of the sample based on the one or more generated interferograms, wherein the surface height measurement is based on interference of a portion of the illumination beam reflected from the sample and a portion of the illumination beam reflected from a surface of the reference flat associated with the plurality of wavelengths; and
  determining a surface slope measurement of the sample along the shearing direction based on the one or more generated interferograms, wherein the surface slope measurement is based on interference between the two beamlets reflected from the surface of the sample associated with the plurality of wavelengths.

36. The method of claim 35, wherein the determining the surface height measurement of the sample and determining a surface slope measurement of the sample along the shearing direction are based on a single sweep of the illumination beam.

37. The method of claim 35, wherein the determining the surface height measurement of the sample and determining a surface slope measurement of the sample along the shearing direction are based on sequential sweeps of the illumination beam.

* * * * *